US007324102B2

(12) United States Patent
Inzinga et al.

(10) Patent No.: US 7,324,102 B2
(45) Date of Patent: Jan. 29, 2008

(54) METHOD FOR GENERATING UNIFIED THREE-DIMENSIONAL MODELS OF COMPLEX INFRASTRUCTURE CONFIGURATIONS

(75) Inventors: Thomas M. Inzinga, Henniker, NH (US); Lisa E. Fox, Sandown, NH (US); Kumud D. Vaidya, Penacook, NH (US); Bradford V. Ek, Jr., Concord, NH (US); Nagesh Narayanaswamy, Manchester, NH (US); Chakravarthy Gavini, Amherst, NH (US)

(73) Assignee: AUTODESK, Inc., San Rafael, CA (US)

( * ) Notice: Subject to any disclaimer, the term of this patent is extended or adjusted under 35 U.S.C. 154(b) by 127 days.

(21) Appl. No.: 11/248,735

(22) Filed: Oct. 12, 2005

(65) Prior Publication Data
US 2007/0080961 A1    Apr. 12, 2007

(51) Int. Cl.
*G06T 15/00* (2006.01)
(52) U.S. Cl. .............................. 345/419; 703/1; 700/98
(58) Field of Classification Search .................. 700/98, 700/118, 182; 703/1, 2; 345/419
See application file for complete search history.

(56) References Cited

U.S. PATENT DOCUMENTS

| 7,164,883    | B2 * | 1/2007  | Rappaport et al. ............. 703/1 |
| 2002/0138228 | A1 * | 9/2002  | Faulkner et al. ............ 702/138 |
| 2002/0161469 | A1 * | 10/2002 | Faulkner et al. ............. 700/98 |
| 2003/0023412 | A1 * | 1/2003  | Rappaport et al. ............. 703/1 |

* cited by examiner

*Primary Examiner*—Leo Picard
*Assistant Examiner*—Charles Kasenge
(74) *Attorney, Agent, or Firm*—Patterson & Sheridan, LLP (57) ABSTRACT

Embodiments of the invention provide a method for creating a complete 3D model of complex infrastructure configurations, such as divided highways, roadway intersections, etc. Current CAD applications have been limited to creating 3D models based on the geometry of a single alignment. In one embodiment, each baseline for a 3D model using four data inputs: a topographical terrain model, an alignment specifying the longitudinal 2D geometry for the structure being modeled, a profile specifying the elevations of the baseline along the horizontal alignment, and the geometry for cross-sectional assemblies along the horizontal and vertical alignments.

24 Claims, 8 Drawing Sheets

CORRIDOR PROPERTIES - CONTROL CENTER

| BASELINES | ALIGNMENT | PROFILE | ASSEMBLY | START SECTION | END SECTION | FREQUENCY |
|---|---|---|---|---|---|---|
| BASELINE (1) | LOCAL ROAD | LOCAL ROAD | FULL SECTION | 11 + 50.00' | 19 + 60.1' | 25.000' |
| REGION (1) | | | NO - CG | 19 + 60.10' | 20 + 39.9' | 2.000' |
| REGION (2) | | | FULL SECTION | 20 + 39.90' | 24 + 00.00' | 25.000' |
| REGION (3) | | | | | | |
| BASELINE (2) | RESIDENTIAL ROAD | RESIDENTIAL ROAD | RES - RD | 1 + 20.00' | 4 + 62.08' | 25.000' |
| REGION (1) | | | | | | |
| BASELINE (3) | RESIDENTIAL ROAD | RESIDENTIAL ROAD | RES - RD | 5 + 34.43' | 7 + 00.00' | 25.000' |
| REGION (1) | | | | | | |
| BASELINE (4) | WEST - CG | W - FL - FG | CURB RETURN | 0 + 00.00' | 0 + 21.82' | 2.000' |
| REGION (1) | | | | | | |
| REGION (2) | | | CURB RETURN | 0 + 21.82' | 0 + 33.54' | 2.000' |
| BASELINE (5) | NORTH - CG | N - FL - FG | CURB RETURN | 0 + 00.00' | 0 + 26.65' | 2.000' |
| REGION (1) | | | | | | |
| BASELINE (6) | EAST - CG | E - FL - FG | CURB RETURN | 0 + 07.31' | 0 + 26.63' | 2.000' |
| REGION (1) | | | | | | |
| REGION (2) | | | CURB RETURN | 0 + 26.63' | 0 + 36.90' | 2.000' |
| BASELINE (7) | SOUTH - CG | S - FL - FG | CURB RETURN | 0 + 00.00' | 0 + 11.73' | 2.000' |
| REGION (1) | | | | | | |
| REGION (2) | | | CURB RETURN | 0 + 11.73' | 0 + 33.52' | 2.000' |

METHOD FOR GENERATING UNIFIED THREE-DIMENSIONAL MODELS OF COMPLEX INFRASTRUCTURE CONFIGURATIONS

CROSS REFERENCE TO RELATED APPLICATIONS

This application is related to commonly assigned U.S. patent application Ser. No. 11/165,319 titled "Graphical User Interface for Interactive Construction of Typical Cross-Section Frameworks," filed on Jun. 23, 2005, which is incorporated by reference herein in its entirety.

BACKGROUND OF THE INVENTION

1. Field of the Invention

The present invention generally relates to computer software. More specifically, the present invention relates to computer software applications configured to facilitate the interactve design of three-dimensional (3D) models that include complex infrastructure configurations.

1. Description of the Related Art

Currently, computer aided design (CAD) applications are available that allow a designer or engineer to generate computer models of real-world 3D objects. Such models are generally based on the of real-world geometry of the object being modeled. Typically, a user interacting with the CAD application supplies a set of input data specifying various attributes or constraints for the object being modeled. The CAD application uses this data to generate a virtual representation of the object being modeled.

One common class of objects modeled using current CAD applications includes longitudinal structures, such as a roadway. Other examples of longitudinal structures that may be modeled include sidewalks, tunnels, dams, bridges, runways, pipelines, individual pipes, conduits, and the like.

A common feature of these real-world objects is that they may be modeled using a series of cross-sections. Within the 3D model, the cross-sections are placed sequentially along a central, longitudinal alignment. The alignment provides a path through the 3D model, and along the path the cross-sections specify the geometry of the structure. For example, a cross-section of a roadway could specify the geometry of road surface lanes and a curb and a gutter located on either side of the roadway. The geometry for the cross-section would be specified by input data such as the width and grade of the road, the height and width of the curbs, and other relevant data values. A CAD application typically generates the 3D model by extruding instances of various cross-sections along the central alignment. The 3D model of the longitudinal structure emerges as the cross-sections are extruded along the central alignment. The data for the completed model may then be used to generate a visual representation of the object, e.g., an onscreen display or a printed blueprint. Additionally, the completed 3D model may be used in a variety of other calculations. For example, the volume of concrete or asphalt required for a given road surface may be calculated.

Problems arise with this approach because current CAD applications generate a 3D model of these structures using a single longitudinal alignment. In reality, however, many real-world longitudinal structures intersect one another. For example, one road may include intersections with a number of other roads. This makes it difficult for a CAD application to generate an accurate 3D model of a complex infrastructure using a single alignment. Because there is only a single alignment representing a main roadway, for example, there is no alignment to position cross-sections representing the intersecting road.

One approach to modeling complex infrastructure configurations has been to generate a different 3D model for each longitudinal alignment. For example, a CAD application may be used to generate a separate 3D model for each of two roads that intersect one another. Integrating the individual 3D models resulting from this approach has proven to be difficult, however. First, because the intersecting regions of an alignment may be included in both 3D models, any engineering calculations using these models may become inaccurate. For example, calculating the volume of concrete or asphalt needed for an intersection may be doubled by such an approach, as the intersection is included in both alignments. Second, intersecting alignments are often much more complicated than a simple crossover point of two longitudinal alignments. For example, a small two-lane residential road may intersect with a larger multi-lane thoroughfare. In such a case, the characteristics of the thoroughfare (e.g., slope, grade, position, materials) dominate the characteristics of the intersection. Thus, even though being modeled separately, the model for the residential road must incorporate substantial elements that are more accurately associated with the larger thoroughfare.

Another approach has been to selectively omit sections of the infrastructure being modeled from one of the two intersecting alignments. This allows for more accurate engineering calculations, but ignores one of the reasons for using a CAD application—to develop a representation of the real world structure that models the totality thereof. Moreover, building a number of individual alignments in separate models can quickly become unwieldy.

Accordingly, there remains a need for an improved CAD application configured to model complex infrastructure configurations, in general, and for a CAD application that can effectively model infrastructures that include one or more longitudinal alignments, in particular.

SUMMARY OF THE INVENTION

Embodiments of the invention provide a method, a computer-readable medium, and an apparatus for modeling complex infrastructure configurations. In one embodiment, users define the geometry for a complex infrastructure by defining a plurality of baselines for a single 3D model. Each baseline is a data object representing the geometry for a longitudinal structure that exists in the real-world structure being modeled. In one embodiment, a baseline may be specified using four data inputs: a topographical terrain model, an alignment specifying the 2-dimensional (2D) geometry of the structure being modeled in a horizontal plane, a vertical alignment specifying elevations of the horizontal alignment, and the geometry for cross-sectional assemblies along the path defined by the horizontal and vertical alignments.

Additionally, the CAD application may allow a user to define one or more regions for each baseline. Each region specifies a beginning and ending station along the baseline. As used herein, a station represents a discrete location on the baseline within the 3D model. Thus, regions may be used to define different segments along a baseline. For each region, a user may specify which cross-section should be extruded by the CAD application along the baseline, along with a frequency rate at which to repeat the cross-section. For example, in composing a 3D model representing a remote stretch of road, the frequency may specify that a roadway cross-section should be repeated only once every fifty feet along the baseline. For greater granularity, e.g., where the remote road eventually intersects an interstate, the frequency may specify that the cross-section geometry specified for the intersection should be repeated every two feet. The ability to increase the granularity allows for greater accuracy in calculations based on the completed 3D model, and also provides an engineer with finer control over the design of the intersecting baselines, without having to apply the same granularity to relatively unchanging portions of the 3D model.

As multiple baselines may be specified for a single 3D model, users may create a comprehensive 3D model that includes multiple longitudinal structures. By allowing multiple baselines in a single 3D model, users may easily compose models reflecting the complex infrastructure that frequently occur in real-world applications.

For purposes of illustrating the present invention, examples are described herein with reference to a CAD application being used to construct a 3D model of a first longitudinal structure comprising a multiple lane thoroughfare that intersects a second longitudinal structure comprising a two-lane residential road. Additionally, although the complex infrastructures described herein generally include intersecting baselines, embodiments of the invention may be used to generate 3D models of complex infrastructures that include multiple, non-intersecting baselines. For example, a 3D model may be generated that includes a first baseline representing a freeway system that runs parallel to a second baseline representing a commuter railway.

In various embodiments, the CAD application may be configured to display a collection of graphical user interface (GUI) elements that allow a user to specify the input data used to create a 3D model (e.g., menus, dialog boxes, checkboxes, radio buttons, text forms, etc.). Because these GUI elements are known, this specification omits a detailed discussion thereof. However, nothing herein should be read to limit embodiments of the invention to these known GUI constructs, and embodiments of the invention may be adapted to new GUI constructs or interfaces as they become available.

BRIEF DESCRIPTION OF THE DRAWINGS

So that the manner in which embodiments of the present invention may be understood in detail, a more detailed description of the invention, briefly summarized above, may be had by reference to the appended drawings. These drawings, however, illustrate typical embodiments of the invention and are not meant to be limiting of its scope, for the invention may admit to other equally effective embodiments.

DETAILED DESCRIPTION OF THE PREFERRED EMBODIMENTS

Embodiments of the invention provide a method for creating a complete 3D model of complex infrastructure configurations, such as divided highways, roadway intersections, etc. Current CAD applications have been limited to creating 3D models based on a single longitudinal alignment. Embodiments of the invention overcome this limitation by providing a CAD application configured to generate 3D models with multiple, baselines. Each baseline represents the horizontal alignment of an infrastructure object within a 3D model. Generally, a baseline may be represented using a collection of data regarding the horizontal alignment within a given 3D model. Accordingly, a baseline may include data regarding the horizontal alignment, along with data representing a profile, assembly, stationing, and regions for the baseline. Each of these baseline data elements are described more fully below.

Figure 1:
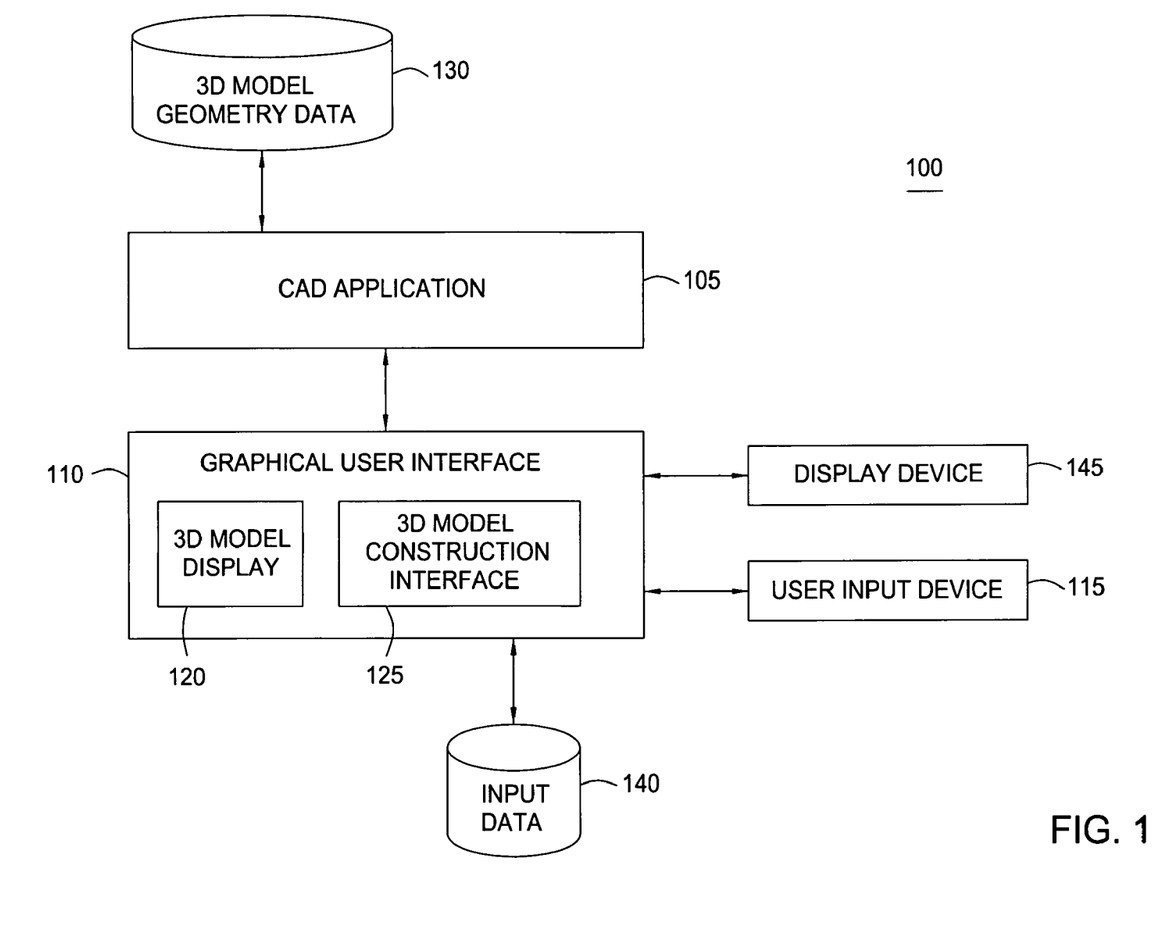
FIG. 1 is a functional block diagram illustrating a system for generating 3D computer models of complex infrastructure configurations, according to one embodiment of the invention.

FIG. 1 is a functional block diagram illustrating an exemplary CAD environment 100 for generating a 3D computer model of complex infrastructure configurations. In one embodiment, the components provided by environment 100 include computer software applications executing on existing computer systems, e.g., desktop computers, server computers, laptop computers, tablet computers, and the like. The CAD application described herein, however, is not limited to any currently existing computing environment, and may be adapted to take advantage of new computing systems as they become available.

As shown, the CAD environment 100 includes, without limitation, a CAD application program 105, a graphical user interface 110 that includes a 3D model display 120 and a 3D model construction interface 125, a user input device 115, a display device 145, 3D model geometry data 130, and input data 140.

Additionally, the software components illustrated in FIG. 1 may be executing on distributed systems communicating over computer networks including local area networks or disparate wide area networks, such as the Internet. For example, the graphical user interface 110 may include a software program executing on a client computer system communicating with the CAD application 105 and the database 130 resident on a networked server computer.

In one embodiment, the CAD application 105 is a computer program configured to generate a 3D model using input data 140. Preferably, the Civil 3D® application program and associated utilities available from Autodesk, Inc. may be used. The 3D model generated by CAD application 105 includes the alignment, characteristics, appearance, and geometry of the real-world structure represented by the 3D model.

The graphical user interface 110 may provide GUI elements that allow a user to add additional baselines to the 3D model. As a user specifies the characteristics of the real-world structure being modeled, 3D computer model display 120 provides a visual representation of the 3D model on display device 145. The data for the 3D model may be stored in database 130. Further, data stored in database 130 may be used as the input for additional engineering calculations related to the 3D model, as well as used by the CAD application 105 to generate 3D model display 120. Input devices 115 allow a user to interact with the 3D model construction interface 125. Typically, user input devices 115 include a mouse pointing device and a keyboard.

Input data 140 specifies the geometry data for the 3D model that is supplied to the CAD application. For example, input data 140 may be entered manually using model construction interface 125. Alternatively, the input data 140 may be provided by other data sources (e.g., files, database records, and the like), and accessed by CAD application 105. FIGS. 2A-2D illustrate a graphical representation of input data 140 used to generate a 3D model of a given baseline. In this example, the input data 140 illustrated in FIGS. 2A-2D defines a baseline for one of two intersecting roadways.

Figure 2A:
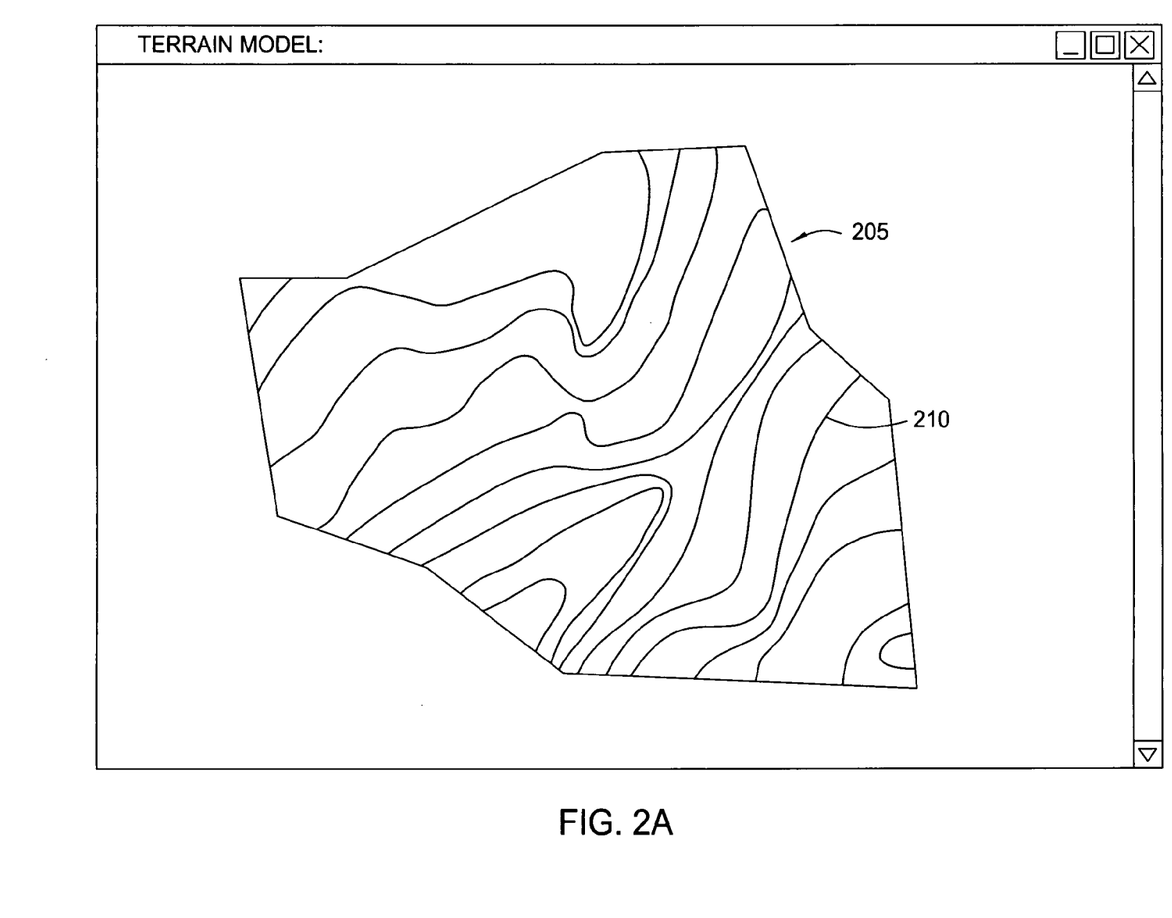
FIGS. 2A-2D illustrate a graphical representation of input data used to generate a 3D computer model, according to one embodiment of the invention.
Figure 2B:
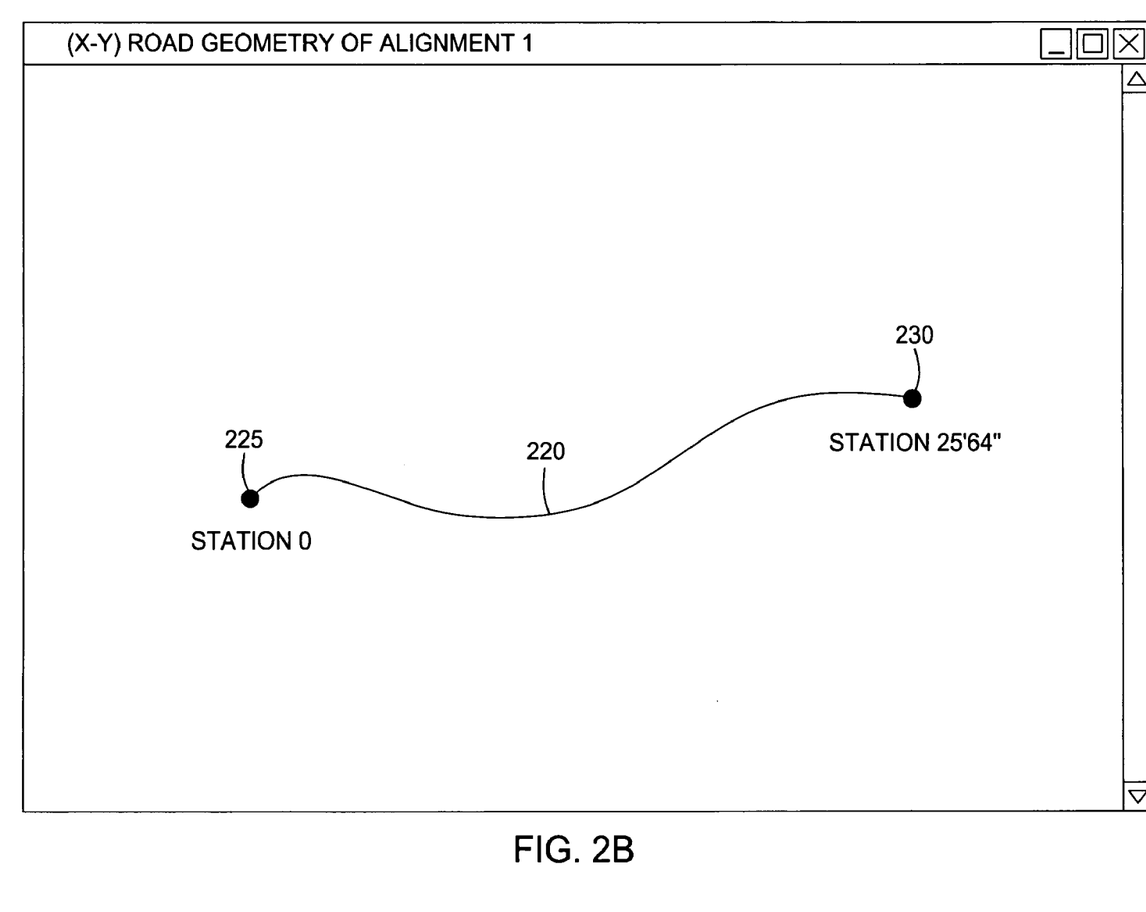
Figure 2C:
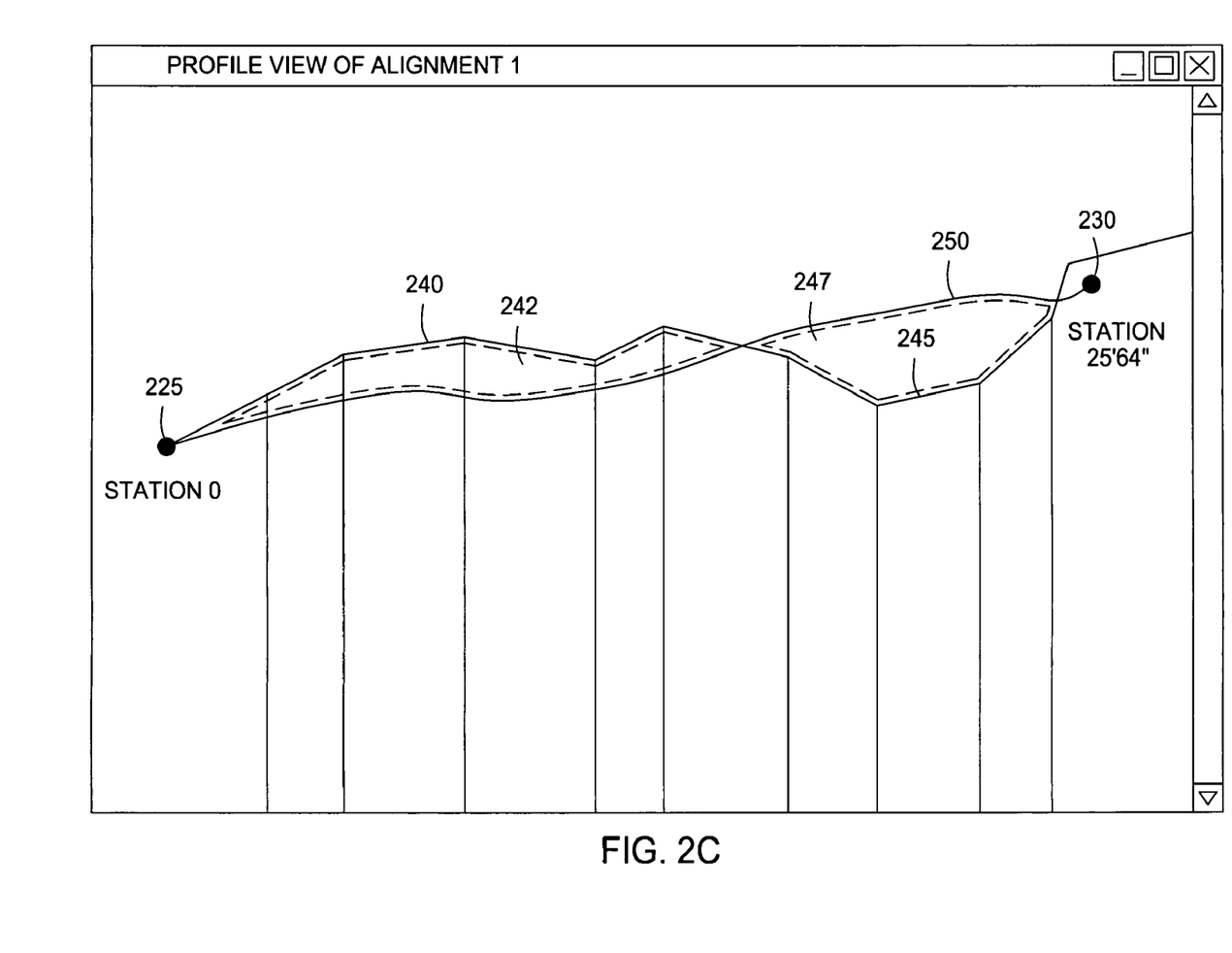
Figure 2D:
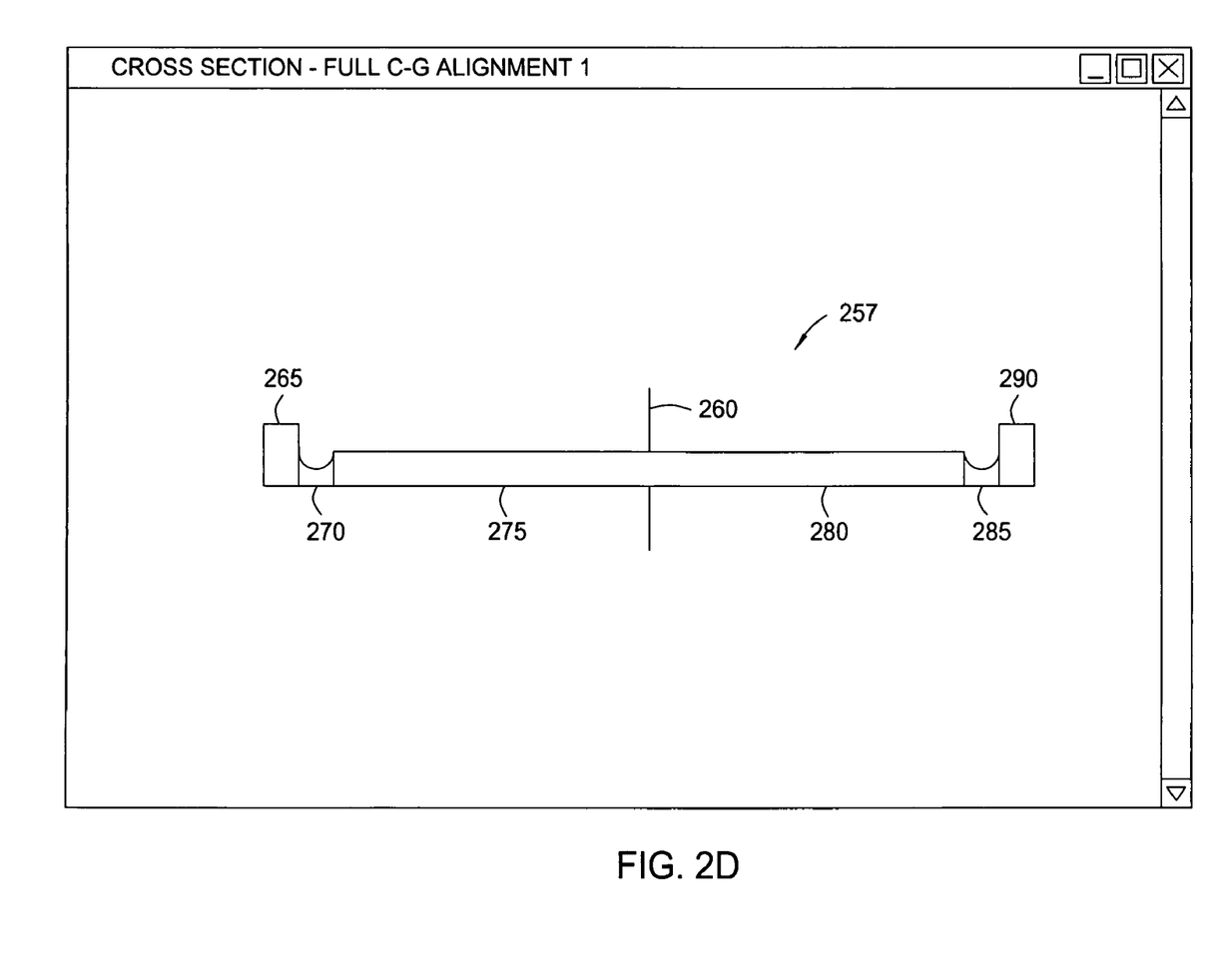
Figure 3:
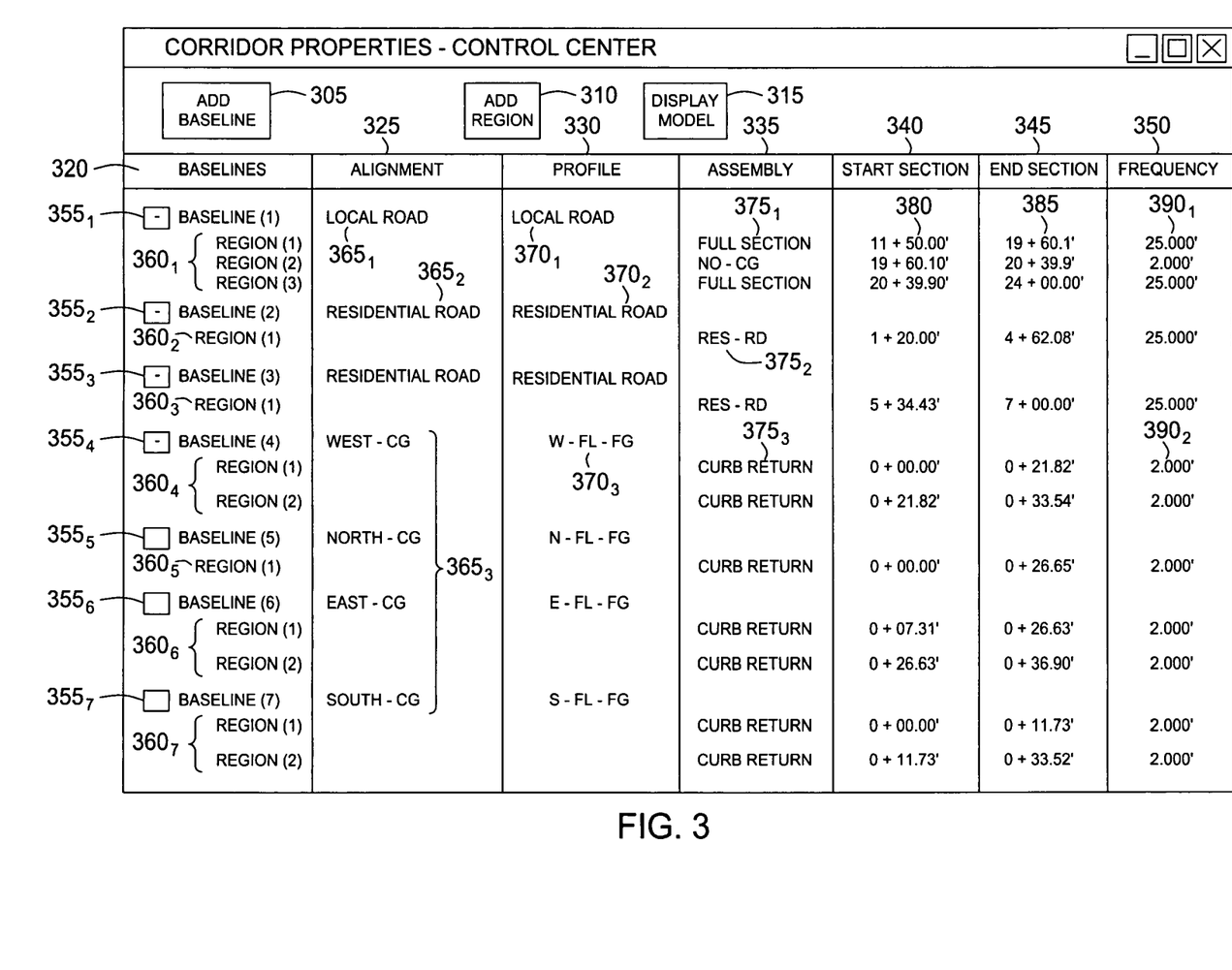
FIG. 3 illustrates an exemplary graphical user interface screen displaying input data for multiple, intersecting alignments, according to one embodiment of the invention.
Figure 4:
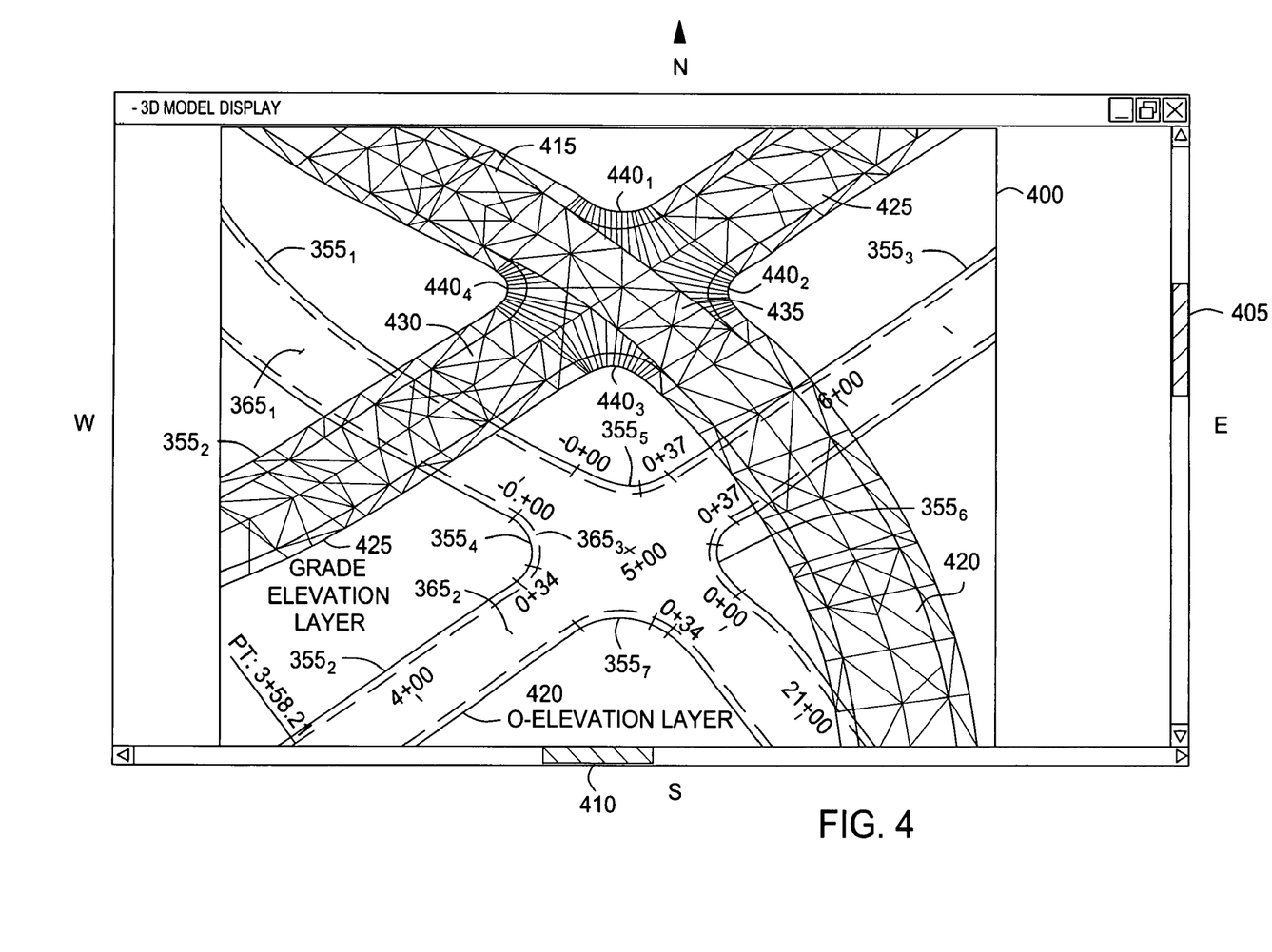
FIG. 4 illustrates an exemplary graphical user interface screen displaying a completed 3D model that includes multiple, intersecting alignments, according to one embodiment of the invention.

As stated above, in one embodiment, the input data 140 for a given baseline may include four geometric inputs. First, a digital terrain model is provided representing the geographic topography of the area being modeled (FIG. 2A). Second, a horizontal alignment is provided that defines a longitudinal geometry for the baseline in an x-y plane (FIG. 2B). Third, a vertical alignment is provided that defines the elevations of the horizontal alignment (FIG. 2C). Finally, the geometry of cross-section assemblies used for a given baseline are provided (FIG. 2D). In one embodiment, a cross-section assembly defines the geometry of real-world structures being modeled, e.g., the geometry of roadway lanes, medians, shoulders, curb-and-gutters, and side slope, etc. Additionally, FIG. 3 illustrates an exemplary graphical user interface screen used to create, display and modify the input data 140 for a set of baselines included in a 3D model of two intersecting roads, and FIG. 4 illustrates a 3D model of the intersecting roads generated from the baselines illustrated in FIG. 3.

FIG. 2A illustrates a graphical representation of a terrain model 205 used to generate a given 3D model. The terrain model defines the geographic topography present for a particular location. Typically, the topography represents the geographic features present in the real-world location being modeled. Depending on the application, a 3D model may include one or more terrain models that may each be used to represent portions of both existing ground surfaces (and sub-surfaces). In this example, terrain model 205 represents an area used in modeling the intersection of two roads. As illustrated, graphical representation 200 includes a bounded region specifying the area where data for the terrain model 205 is available. Contour lines (e.g., contour line 210) running through the terrain model 205 represent locations in the terrain model 205 that share a common elevation.

FIG. 2B illustrates a graphical representation of a component of input data 140 that specifies a horizontal alignment 220 for the baseline. The horizontal alignment 220 defines the 2D shape of a longitudinal structure being modeled. Illustratively, the graphical representation provides a top view of the geometry associated with a given baseline. In this case, alignment 220 represents the shape of a roadway, as viewed from above. Typically, the horizontal alignment 220 specifies a center or medial position of the baseline in an x-y plane corresponding to the terrain model 205. As illustrated, the horizontal alignment 220 includes a beginning station 225 and an ending station 230. The station values provide a convenient method for specifying any location along a particular alignment.

FIG. 2C illustrates a graphical representation of a component of input data that specifies a vertical alignment 250 for the baseline. The vertical alignment 250 provides a side view of the horizontal alignment 220 that shows the elevation of the 3D structure being modeled. In this example, the vertical alignment 250 corresponds to the elevations of the roadway being modeled along the horizontal alignment. As illustrated, the elevations for the vertical alignment 250 appear superimposed over the actual elevations, based on the terrain model 205. For example, the elevation segment 240 represents the elevation between two contour lines appearing in the terrain model 205. Accordingly, the area 242 enclosed by the contour line elevations from terrain model 205 and the vertical alignment 250 would be removed in building the desired roadway. Similarly, enclosed area 247 would need to be graded to build the desired roadway.

FIG. 2D illustrates a graphical representation of a component of input data 140 that defines particular cross-section geometry for the 3D structure being modeled. Illustratively, assembly 257 defines the geometry for a cross-section of a roadway that includes curb and gutter sections each side of the road. The centerline 260 represents a 3D point in space defined by the horizontal alignment 220 and vertical alignment 250. On either side of the centerline 260, assembly 257 specifies the geometry of the roadway for this cross-section. Each side of centerline 260 includes a roadway lane 275 and 280 along with curb and gutter cross-section 265 and 270 (on the left side of centerline 260) and curb and gutter cross-section 285 and 290 (on the right side of centerline 260). Other assemblies for a road could include different lane configurations or an assembly with no curb and gutter, e.g., where a road traverses an intersection.

In one embodiment, the data inputs illustrated in FIGS. 2A-2D are used to define each baseline for a single 3D model. Together, the baselines define a model of multiple, longitudinal structures within the 3D model. Each baseline specifies the path, or alignment, of the longitudinal structure through a 3D space. Along this path, the cross section assembly specified for the baseline defines the 3D geometry of the structure repeated for every frequency interval. If a given baseline includes multiple regions, different cross section assemblies may be extruded into the 3D model for each such region.

In one embodiment, a cross-section may be specified as an assembly that includes a collection of subassembly components, and each subassembly may include point, link, and shape information defining its geometry. Generally, point information specifies locations on a subassembly where it may be connected with others. Link information specifies how points are connected together within a given 3D model. Thus, link information indicates the connectivity between a pair of points. Shape information defines the geometry for one or more closed shapes formed from the link information for a given subassembly, or group of subassemblies. Shape information may be used in certain engineering calculations related to the geometry being modeled, e.g., the volume of asphalt required to construct a given cross-section of roadway lane, or the length of a gutter defined by multiple cross-sections of the 3D model. Additional examples of cross-section assemblies composed from subassembly elements are described in commonly assigned U.S. patent application Ser. No. 11/165,319 titled "Graphical User Interface for Interactive Construction of Typical Cross-Section Frameworks," filed on Jun. 23, 2005.

Each baseline defined for a 3D model includes the data inputs illustrated in FIGS. 2A-D. By providing input data 140 for multiple baselines, a complex infrastructure may be modeled. For example, FIG. 3 illustrates an exemplary graphical user interface screen 300 used to enter, modify, and the display input data 140 for multiple baselines, according to one embodiment of the invention. Illustratively, the GUI screen 300 includes input data 140 for seven baselines used to model an intersection between two roads. Accordingly, baselines are defined that specify each of the two intersecting roads. In addition, baselines are included in the 3D model defining curb and gutter geometries bordering the edges of the intersection. FIG. 4 illustrates an exemplary graphical user interface screen displaying a completed 3D model generated from the input data 140 displayed on screen 300.

As stated, FIG. 3 displays input data 140 for seven baselines ($355_1$-$355_7$), listed in baseline column 320. Baseline $355_1$, represents the geometry of a multilane road, and includes three regions $360_1$. Baselines $355_2$ and $355_3$ represent a residential road intersecting baseline $355_1$. Baselines $355_{3-7}$ represent four separate curb and gutter sections bordering the intersection modeled by baselines $355_{1-2}$.

Additionally, in one embodiment, multiple regions may be defined for each baseline. Each region specifies a segment at which to extrude a particular cross-section along the horizontal and vertical alignments of a baseline. Because embodiments of the invention allow multiple baselines and regions to be defined for a single 3D model, users are provided a great deal of flexibility in modeling complex infrastructures. For example, baselines $355_{2-3}$ define a residential road, and each of these two baselines includes a single region. In this example, the regions represent segments of the baseline on either side of the intersection. Alternatively, the residential could be modeled by defining a single baseline that included multiple regions. For example, baseline $355_1$ is defined using a single baseline that includes three separate regions. The choice of a particular set of baselines and regions to use in modeling a complex infrastructure configuration is generally left to the discretion of the user.

In one embodiment, the input data 140 displayed in FIGS. 2B-2D are specified in alignment column 325, profile column 330 and assembly column 335, respectively. The alignment column 325 specifies the horizontal alignment for a given baseline. The values in each of these columns is described in reference to baseline-(1) $355_1$.

Elements listed in profile column 330 specify the vertical alignment associated with a given baseline. Illustratively, the profile "local road" $370_1$ corresponds to the vertical elevations of the baseline $355_1$ along horizontal alignment $365_1$. Additionally, baseline-(1) $355_1$ includes three regions $360_1$. Each region defined for baseline $355_1$ corresponds to a segment of the roadway being modeled that begins and ends at the stations specified in columns 340 and 345.

The regions specify what cross-section geometry for the 3D model should be extruded along the segment of the baseline identified by the region. For example, the three regions defined by baseline $355_1$ correspond to a roadway along one side of the intersection, the intersection itself, and the roadway as it extends past the other side of the intersection. Accordingly, the three regions defined for baseline-(1) $355_1$ include a "full section" geometry applied to a segment from a beginning station to the intersection, a "no-cg" geometry applied to the baseline through the intersection, and the "full section" geometry applied to the roadway following the intersection. In this example, the "full section" geometry identifies the assembly 257 illustrated in FIG. 2C. Traversing the path defined by the horizontal and vertical alignments of baseline-(1) $355_1$, once the intersection is encountered, the second region specifies that a cross-section without the curb and gutter should be extruded by the CAD application in generating the 3D model.

Similarly, baselines $355_2$ and $355_3$ define the horizontal and vertical alignments of the intersecting residential road. Region $360_2$ specifies the geometry defined by a "res-rd" assembly $375_2$ should be extruded for the region along the baseline $355_2$ from a beginning station of the roadway to one side of the intersection. Region $360_3$ defines a segment of the residential road that occurs on the other side of the intersection and also specifies that the "res-rd" assembly should be extruded in the 3D model for this region. Finally, the four baselines $355_{3-7}$ specify that geometry defined by a "curb-return" assembly $375_3$ should be extruded for the alignments defined by these baselines.

In one embodiment, users interact with GUI control elements provided by model construction interface 125 to enter or modify the data values illustrated in screen 300. For example, model construction interface 125 may include GUI control elements allowing a user to add additional baselines (button 305), add regions to a selected baseline (button 310), and to display a 3D model generated using the input data specified by screen 300 (button 315). As illustrated, FIG. 3 includes a, more or less, complete set of input data for the roadway intersection being modeled.

FIG. 4 illustrates a 3D model 400 generated from the input data 140 displayed on screen 300, according to one embodiment of the invention. The particular view of 3D model 400 may be controlled using slider controls 405 and 410. In addition, the 3D model display may provide GUI constructs allowing a user to "zoom in" or "zoom out" the display of 3D model 400, or to perform other common tasks.

FIG. 4 illustrates the 3D model of a first road running generally from northwest to southeast as it intersects with a second road running from northeast to southwest. The first road includes segments 415 and 420 corresponding to the first and third regions defined for baseline-(1) $355_1$. Along these segments, the CAD application has extruded the geometry for the "full section" assembly for distances representing twenty five feet. In addition, the second region defined for baseline-(1) $355_1$ includes the intersection 435 of the two roads. Along this segment, the CAD application has extruded the geometry for the "No-CG" assembly for distances representing two feet. Similarly, the two segments 430 and 435 of residential road have been modeled using baselines $355_2$ and $355_3$, one on each side of the intersection. The geometry for these two baselines is specified by the "res-rd" assembly. The intersection includes curb and gutter segments 440, 445, 450, and 455 corresponding to baselines $355_{4-7}$.

As illustrated, the 3D model 400 is displayed using two layers: a 0-elevation 420 layer and a grade-elevation layer 425. A layer represents a common element of the 3D model that can be manipulated or displayed independently from other layers. Illustratively, the 0-elevation layer 420 displays a 2D model of the intersection that does not include the vertical alignment data for the intersecting roads. This layer includes dashed lines indicating each of the horizontal alignments defined by model 300. In addition, some station values along the intersecting baselines $355_{1-3}$ are displayed, as are the station values for the four curb and gutter baselines $355_{4-7}$. The grade-elevation layer 425 displays the complete 3D model of the intersection generated from input data 140. Those skilled in the art will recognize that the display of 3D model 400 may be modified in a variety of ways. For example, the 0-elvevation layer may be removed, or the wire mesh display of the grade-elevation layer 425 may be rendered with a skin to give the 3D model a simulated "finished product" appearance.

Figure 5:
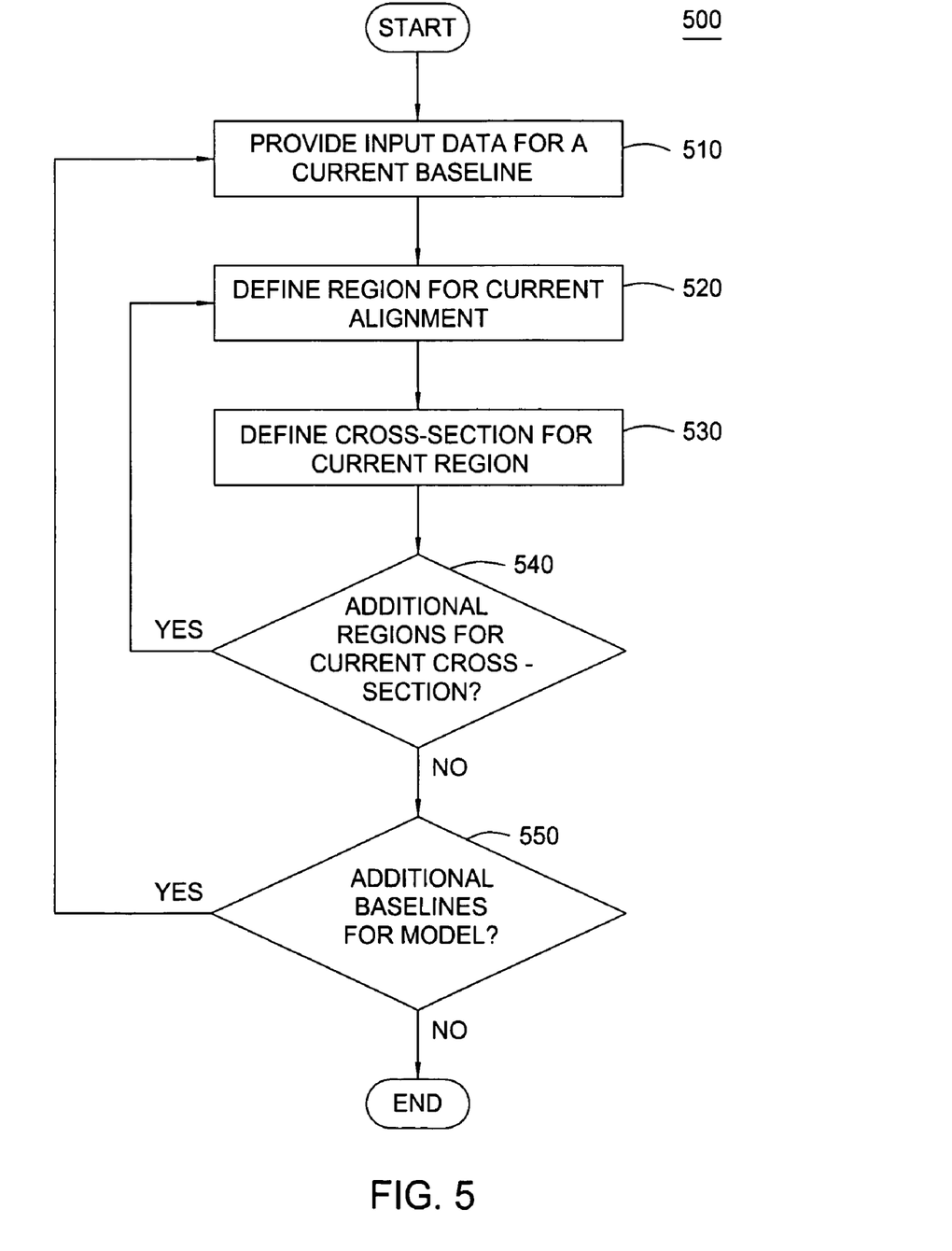
FIG. 5 is a flow chart illustrating a method for creating 3D models of complex infrastructure configurations, according to one embodiment of the invention.

FIG. 5 illustrates a method 500 for building a 3D model of a complex infrastructure configuration. In one embodiment, the method 500 may be performed, for example, by a CAD application 105 responding to user input. Accordingly, graphical user interface 110 may be configured to present a user with a model construction interface 125, such as the one illustrated in FIG. 3. The method 500 begins at step 510, where the input data 140 for a particular baseline is provided. Accordingly, at step 510, a user may provide the input data 140 including, the terrain model, horizontal alignment, vertical alignment, and cross-sections for the baseline.

At step 520, a region is defined for the current baseline. In one embodiment, the graphical user interface 110 may be configured to allow the user to specify data for a new region. For example, the starting station and ending station for the region may be specified. At step 530, once a region is defined, a user may select cross-section geometry to apply to the region. Illustratively, a user may select from a number of predefined cross-sections, such as the "local road" "no-cg" and "res-rd" cross sections discussed above. Alternatively, the CAD application 105 and interface 110 may allow users to compose new cross-section geometries using the techniques described in the "Graphical User Interface for Interactive Construction of Typical Cross-Section Frameworks" patent application, referenced above. Additionally, a user may specify the frequency at which the cross-section should be repeated for the region. This gives a user control over the granularity at which data is generated for the cross-section geometry selected for the region.

At step 540, if the user wishes to define additional regions for the current baseline, then the method 500 returns to step 520. Otherwise, at step 550, a user may add another baseline to the current 3D model by returning to step 510. If no additional baselines are required for the current 3D model, then the method 500 terminates.

One skilled in the art would recognize that the CAD application of the present invention may be used in an iterative manner. That is, after performing the method 500, a 3D model with multiple baselines may be viewed on a display device (e.g., the display 400 illustrated in FIG. 4). A visual review of the display may reveal deficiencies with the model that may be corrected by modifying the input data 140 for the baselines defined for the 3D model (e.g., by using interface 125 displayed on screen 300). By alternating between the model construction interface 125 and the model display 120, a user may refine a 3D model to a desired level of both detail and accuracy.

In sum, embodiments of the invention provide techniques for generating a single 3D model of complex infrastructure configurations, such as divided highways, roadway intersections, etc. Rather than creating a model based on a single longitudinal baseline, embodiments of the invention provide a CAD application configured to compose 3D models with multiple, possibly intersecting baselines.

While the foregoing is directed to embodiments of the present invention, other embodiments of the invention may be devised without departing from the basic scope thereof, and the scope thereof is determined by the claims that follow.

What is claimed is:

1. A computer-implemented method for generating a three-dimensional (3D) model of a complex infrastructure, comprising:
generating a first baseline representing a first geometry for a first longitudinal structure based on a supplied set of input data for the first baseline;
generating a second baseline representing a second geometry for a second longitudinal structure based on a supplied set of input data for the second baseline, wherein the input data for each of the first and second baselines specifies a topographical terrain model, a horizontal alignment specifying the shape of the corresponding longitudinal structure relative to the terrain model, a vertical alignment specifying elevations of the corresponding longitudinal structure along the horizontal alignment, and data defining a geometry of a cross-section for the corresponding longitudinal structure; and
producing a single 3D model of the complex infrastructure that includes the first and second baselines.

2. The method of claim 1, wherein the input data further specifies a plurality of discrete regions along the horizontal and vertical alignment, and further specifies the geometry for the cross-section of the corresponding longitudinal structure for each of the discrete regions.

3. The method of claim 1, wherein the geometry for at least one cross-section is specified by point, link, and shape information.

4. The method of claim 3, wherein point information specifies locations on the cross-section where the cross-section may be connected to another, link information specifies connectivity between at least two point locations of a subassembly, and wherein shape information defines at least one closed shape formed from the link information.

5. The method of claim 1, wherein the first longitudinal structure and the second longitudinal structure intersect with one another in the single 3D model.

6. The method of claim 1, wherein the first longitudinal structure and the second longitudinal structure do not intersect with one another in the single 3D model.

7. The method of claim 1, further comprising the step of, performing at least one engineering calculation based on the single 3D model produced from the baselines representing the geometries of the first and second longitudinal structures.

8. The method of claim 1, further comprising the step of, presenting an on-screen display of the single 3D model produced from the first and second baselines representing the geometries of the first and second longitudinal structures.

9. A computer-readable medium containing a program which when executed by a processor, performs operations for generating a single 3D model of a complex infrastructure, comprising:
generating a first baseline representing a first geometry for a first longitudinal structure based on a supplied set of input data for the first baseline;
generating a second baseline representing a second geometry for a second longitudinal structure based on a supplied set of input data for the second baseline, wherein the input data for each of the first and second baselines specifies a topographical terrain model, a horizontal alignment specifying the shape of the corresponding longitudinal structure relative to the terrain model, a vertical alignment specifying elevations of the corresponding longitudinal structure along the horizontal alignment, and data defining a geometry of a cross-section for the corresponding longitudinal structure; and producing a single 3D model of the complex infrastructure that includes the first and second baselines.

10. The computer-readable medium of claim 9, wherein the input data further specifies a plurality of discrete regions along the horizontal and vertical alignment, and further specifies the geometry for the cross-section of the corresponding longitudinal structure for each of the discrete regions.

11. The computer-readable medium of claim 9, wherein the geometry for at least one cross-section is specified by point, link, and shape information.

12. The computer-readable medium of claim 11, wherein point information specifies locations on the cross-section where the cross-section may be connected to another, link information specifies connectivity between at least two point locations of a subassembly, and wherein shape information defines at least one closed shape formed from the link information.

13. The computer-readable medium of claim 9, wherein the first longitudinal structure and the second longitudinal structure intersect with one another in the single 3D model.

14. The computer-readable medium of claim 9, wherein the first longitudinal structure and the second longitudinal structure do not intersect with one another in the single 3D model.

15. The computer-readable medium of claim 9, wherein the operations further comprise, performing at least one engineering calculation based on the single 3D model produced from the baselines representing the geometries of the first and second longitudinal structures.

16. The computer-readable medium of claim 9, wherein the operations further comprise, presenting an on-screen display of the single 3D model produced from the first and second baselines representing the geometries of the first and second longitudinal structures.

17. A computing device comprising:
a processor; and
a memory configured to store an application that includes instructions which, when executed by the processor, cause the processor to generate a computer model of a complex infrastructure by performing at least the steps of:
generating a first baseline representing a first geometry for a first longitudinal structure based on a supplied set of input data for the first baseline;
generating a second baseline representing a second geometry for a second longitudinal structure based on a supplied set of input data for the second baseline, wherein the input data for each of the first and second baselines each specifies a topographical terrain model, a horizontal alignment specifying the shape of the corresponding longitudinal structure relative to the terrain model, a vertical alignment specifying elevations of the corresponding longitudinal structure along the horizontal alignment, and data defining a geometry of a cross-section for the longitudinal structure; and
producing a single 3D model of the complex infrastructure that includes the first and second baselines.

18. The computing device of claim 17, wherein the input data further specifies a plurality of discrete regions along the horizontal and vertical alignment, and further specifies the geometry for the cross-section of the corresponding longitudinal structure for each of the discrete regions.

19. The computing device of claim 17, wherein the geometry for at least one cross-section is specified by point, link, and shape information.

20. The computing device of claim 19, wherein point information specifies locations on the cross-section where the cross-section may be connected to another, link information specifies connectivity between at least two point locations of a subassembly, and wherein shape information defines at least one closed shape formed from the link information.

21. The computing device of claim 17, wherein the first longitudinal structure and the second longitudinal structure intersect with one another in the single 3D model.

22. The computing device of claim 17, wherein the first longitudinal structure and the second longitudinal structure do not intersect with one another in the single 3D model.

23. The computing device of claim 17, further comprising the step of, performing at least one engineering calculation based on the single 3D model produced from the baselines representing the geometries of the first and second longitudinal structures.

24. The computing device of claim 17, further comprising the step of, presenting an on-screen display of the single 3D model produced from the first and second baselines representing the geometries of the first and second longitudinal structures.

* * * * *

UNITED STATES PATENT AND TRADEMARK OFFICE
CERTIFICATE OF CORRECTION

PATENT NO. : 7,324,102 B2  Page 1 of 1
APPLICATION NO. : 11/248735
DATED : January 29, 2008
INVENTOR(S) : Inzinga et al.

It is certified that error appears in the above-identified patent and that said Letters Patent is hereby corrected as shown below:

In column 10, line 59, please start a new paragraph after "and"

In column 12, lines 6-7, please replace "the longitudinal", with --the corresponding longitudinal--

Signed and Sealed this

Third Day of June, 2008

JON W. DUDAS
*Director of the United States Patent and Trademark Office*